United States Patent
Ho

(10) Patent No.: US 8,150,348 B2
(45) Date of Patent: Apr. 3, 2012

(54) TV TUNER AND THE MANUFACTURING METHOD THEREOF

(75) Inventor: Wen-Po Ho, Sinshih Township (TW)

(73) Assignee: Himax Technologies Limited, Sinshih Township (TW)

(*) Notice: Subject to any disclaimer, the term of this patent is extended or adjusted under 35 U.S.C. 154(b) by 1406 days.

(21) Appl. No.: 11/692,234

(22) Filed: Mar. 28, 2007

(65) Prior Publication Data

US 2008/0062335 A1  Mar. 13, 2008

(30) Foreign Application Priority Data

Sep. 12, 2006 (TW) .................... 95133753 A

(51) Int. Cl.
*H04B 1/18* (2006.01)

(52) U.S. Cl. ...... 455/180.2; 455/77; 455/87; 455/169.2; 455/180.4; 348/725; 348/731

(58) Field of Classification Search .......... 455/77, 455/87, 130, 169.2, 178.1, 180.2, 180.4, 455/182.3, 188.2, 191.2, 192.3, 193.3, 197.2; 348/725, 731

See application file for complete search history.

(56) References Cited

U.S. PATENT DOCUMENTS

| 4,379,271 | A | * | 4/1983 | Lehmann | 331/49 |
| 4,905,306 | A | * | 2/1990 | Anderson | 455/191.3 |
| 2007/0241985 | A1 | * | 10/2007 | Suzuki et al. | 343/860 |
| 2009/0033805 | A1 | | 2/2009 | Miyake et al. | |

FOREIGN PATENT DOCUMENTS

| EP | 1337042 A1 | 8/2003 |
| JP | 2004146818 A | 5/2004 |
| JP | 2006197450 A | 7/2006 |
| KR | 20030049414 A | 6/2003 |
| KR | 20040034217 A | 4/2004 |
| KR | 20040048488 A | 6/2004 |

* cited by examiner

*Primary Examiner* — Tuan Pham

(74) *Attorney, Agent, or Firm* — Lowe, Hauptman, Ham & Berner, LLP

(57) ABSTRACT

A TV tuner includes an Ultra High Frequency (UHF)/Very High Frequency (VHF) tracking filter, an UHF/VHF matching circuit and a single conversion Tuner IC. The UHF/VHF tracking filter includes a first Low-Temperature Co-fired Ceramics (LTCC) inductor, a first varactor diode and a fine-tune capacitor electrically connected to determine the maximum gain frequency of the UHF/VHF tracking filter. The UHF/VHF matching circuit includes a second LTCC inductance, a second varactor diodes and a fine-tune capacitor electrically connected to determine the maximum gain frequency of the UHF/VHF matching circuit.

7 Claims, 6 Drawing Sheets

TV TUNER AND THE MANUFACTURING METHOD THEREOF

RELATED APPLICATIONS

This application claims priority to Taiwan Application Serial Number 95133753, filed Sep. 12, 2006, which is herein incorporated by reference.

BACKGROUND

1. Field of Invention

The present invention relates to a TV tuner and a manufacturing method thereof. More particularly, the present invention relates to an ultra high frequency/very high frequency TV tuner.

2. Description of Related Art

A TV tuner plays an important role in the digital TV, a Set Top Box and a portable transmitting/receiving communication system. The TV tuner is used to amplify the received radio frequency (RF) signal, select the desired signal and filter out the undesired signal to prevent undesired signals affecting the desired ones. After that, the TV tuner lowers the filtered RF signal to an Intermediate Frequency signal.

Because the digital TV needs to be portable, the demands for small digital TVs has increased. However, the air coils used in the TV tuner require a lot of space and need to be plugged in by human hands, which increases the cost and makes portability difficult.

For the forgoing reasons, there is a need for a new TV tuner for a small, portable digital TV.

SUMMARY

According to one embodiment of the present invention, a TV tuner having an Ultra High Frequency (UHF) tracking filter, a UHF matching circuit and a single conversion Tuner IC, characterized in that the UHF tracking filter includes at least one first Low-Temperature Co-fired Ceramics (LTCC) inductor, a first varactor diode and a fine-tune capacitor electrically connected to determine the maximum gain frequency of the UHF tracking filter; the UHF matching circuit includes at least one second LTCC inductor, a second varactor diode and a capacitor electrically connected to determine the maximum gain frequency of the UHF matching circuit.

According to another embodiment of the present invention, a TV tuner having a Very High Frequency (VHF) tracking filter, a VHF matching circuit and a single conversion Tuner IC, characterized in that the VHF tracking filter includes at least one first LTCC inductor, a first varactor diode and a fine-tune capacitor electrically connected to determine the maximum gain frequency of the VHF tracking filter; the VHF matching circuit includes at least one second LTCC inductor, a second varactor diode and a capacitor electrically connected to determine the maximum gain frequency of the VHF matching circuit.

According to another embodiment of the present invention, a method for manufacturing a TV tuner which has a UHF tracking filter, a UHF matching circuit and a single conversion Tuner IC, characterized in that using LTCC inductors in the UHF tracking filter and the UHF matching circuit to determine the maximum gain frequency; tuning the single conversion Tuner IC for a tuned-voltage, in which the tuned-voltage determines the capacitances of a first varactor diode and a second varactor diode of the UHF tracking filter and the UHF matching circuit respectively; and tuning the capacitance of a fine-tune capacitor of the UHF tracking filter and the inductance of the LTCC inductor of the UHF matching circuit to determine the maximum gain frequency of the UHF tracking filter and the UHF matching circuit.

According to another embodiment of the present invention, a method for manufacturing a TV tuner which has a Very High Frequency (VHF) tracking filter, a VHF matching circuit and a single conversion Tuner IC, characterized in that using LTCC inductors in the VHF tracking filter and the VHF matching circuit to determine the maximum gain frequency; tuning the single conversion Tuner IC for a tuned-voltage, wherein the tuned-voltage determines the capacitances of a first varactor diode and a second varactor diode of the VHF tracking filter and VHF matching circuit respectively; and tuning the capacitance of a fine-tune capacitor of the VHF tracking filter and the inductance of the LTCC inductor of the VHF matching circuit to determine the maximum gain frequency of the VHF tracking filter and the VHF matching circuit.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
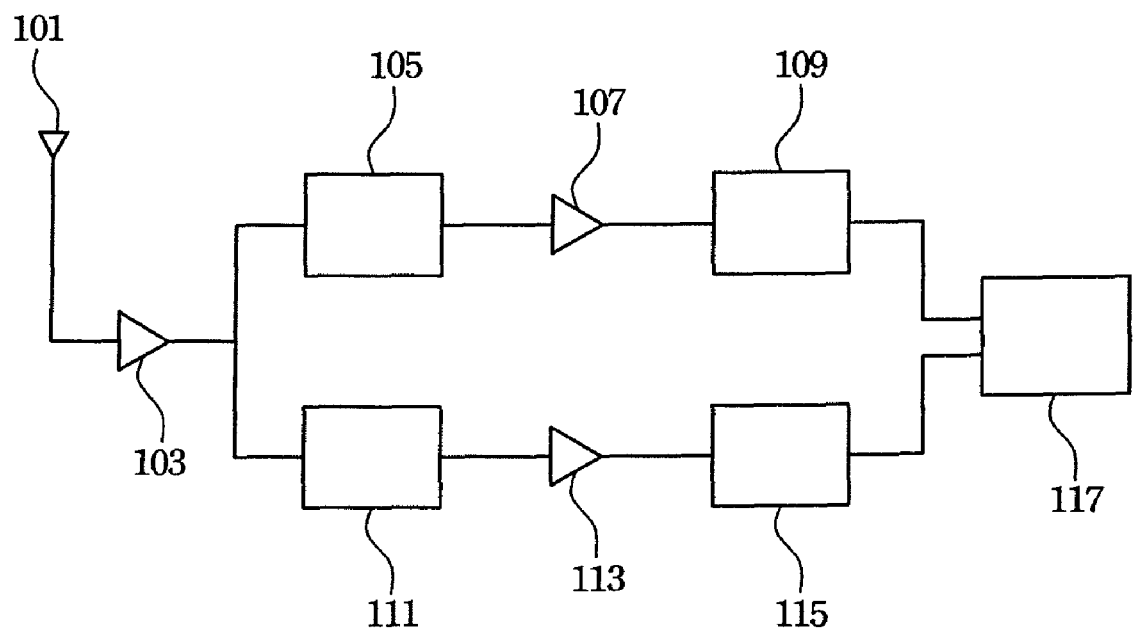
FIG. 1 is a TV tuner according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a TV tuner according to one embodiment of the present invention. The TV tuner includes an antenna 101, a pre-amplifier 103, an Ultra High Frequency (UHF) tracking filter 105, two second amplifiers 107 and 113, a UHF matching circuit 109, a Very High Frequency (VHF) tracking filter 111, a VHF matching circuit 115 and a single conversion Tuner IC 117.

The antenna 101 is electrically connected to the pre-amplifier 103, and the pre-amplifier 103 is electrically connected to the UHF tracking filter 105 and the VHF tracking filter 111. The UHF tracking filter 105, the second amplifier 107 and the UHF matching circuit 109 are electrically connected, and the VHF tracking filter 111, the second amplifiers 113 and the VHF matching circuit 115 are also electrically connected. In addition, the UHF matching circuit 109 and the VHF matching circuit 115 are electrically connected to the single conversion Tuner IC 117. The UHF tracking filter 105, the UHF matching circuit 109, the VHF tracking filter 111 and the VHF matching circuit 115 use LTCC inductors instead of air coils.

Figure 2A:
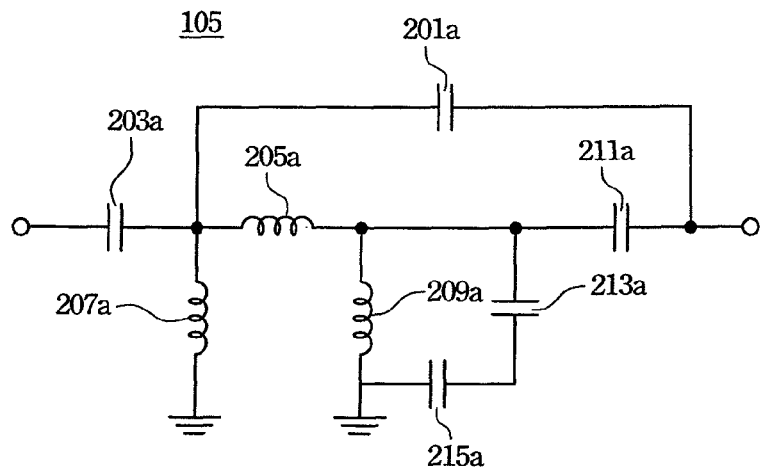
FIG. 2A is an Ultra High Frequency (UHF) tracking filter according to one embodiment of present invention.

FIG. 2A is the UHF tracking filter 105 according to one embodiment of the present invention. The UHF tracking filter 105 includes a first varactor diode 213a, a fine-tune capacitor 215a and a first LTCC inductor 209a. The first end of the first varactor diode 213a is connected to the first end of the fine-tune capacitor 215a, the first end of the first LTCC inductor 209a is electrically connected to the second end of the fine-tune capacitor 215a, the second end of the first LTCC inductor 209a is electrically connected to the second end of the first varactor diode 213a. In addition, capacitors 201a, 203a, 211a and the LTCC inductors 205a and 207a are electrically connected to the first varactor diode 213a and the first LTCC inductor 209a.

Figure 2B:
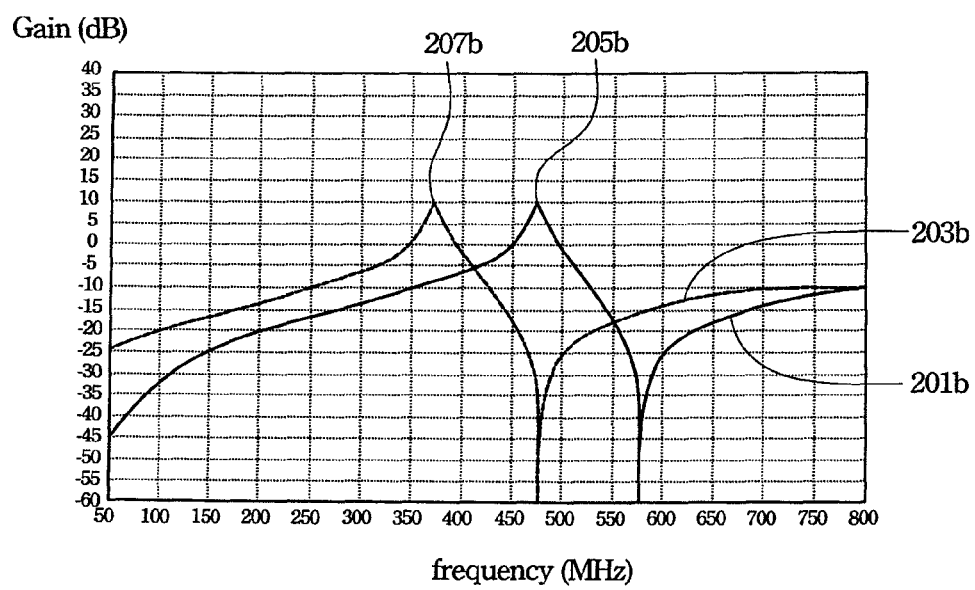
FIG. 2B is the frequency response of the UHF tracking filter according to one embodiment of present invention.

FIG. 2B is the frequency response of the UHF tracking filter 105. Because the capacitances of the first varactor diode 213a and the fine-tune capacitor 215a are inversely proportional to the frequency response of the UHF tracking filter 105, such that the maximum gain frequency of the UHF tracking filter 105 can be tuned by tuning the capacitance of the first varactor diode 213a or the fine-tune capacitor 215a. For example, if the capacitances of the first varactor diode 213a and fine-tune capacitor 215a increase, the frequency response of the UHF tracking filter 105 decreases from the solid line 201b to the dotted line 203b. As a result, the maximum gain frequency of the UHF tracking filter 105 decreases from 205b to 207b.

Figure 3A:
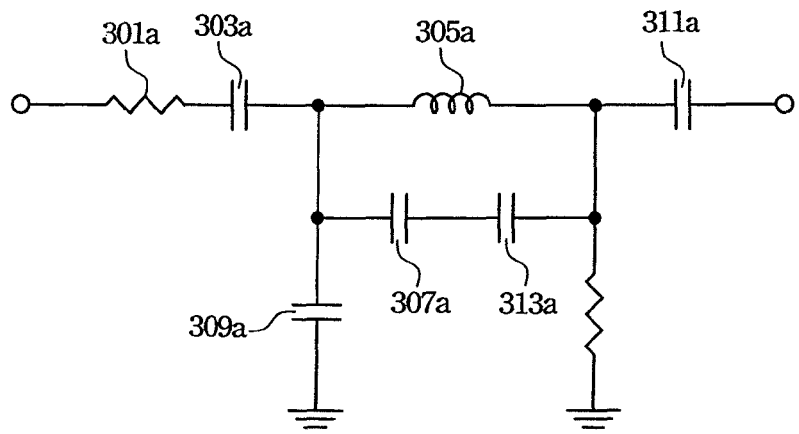
FIG. 3A is a UHF matching circuit according to one embodiment of present invention.

FIG. 3A is the UHF matching circuit 109 according to one embodiment of the present invention. The UHF matching circuit 109 includes a second LTCC inductor 305a, a second varactor diode 313a and a capacitor 307a. The first end of the second varactor diode 313a is electrically connected to the first end of the capacitor 307a, the first end of the second LTCC inductor 305a is electrically connected to the second end of the second varactor diode 313a, and the second end of the second LTCC inductor 305a is electrically connected to the second end of the capacitor 307a. In addition, capacitors 303a, 309a, 311a and resistor 301a are electrically connected to the second LTCC inductor 305a, the second varactor diode 313a and the capacitor 307a.

Figure 3B:
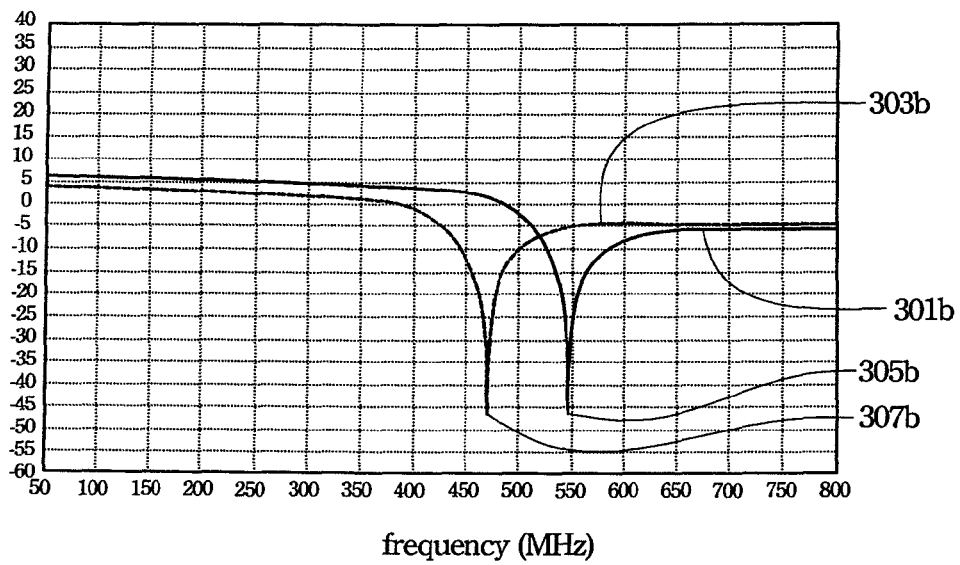
FIG. 3B is the frequency response of the UHF matching circuit according to one embodiment of present invention.

FIG. 3B is the frequency response of the UHF matching circuit 109. Because the inductance of the second LTCC inductor 305a and the capacitance of the second varactor diode 313a are inversely proportional to the frequency response of the UHF matching circuit 109, such that the maximum gain frequency of the UHF matching circuit 109 can be tuned by tuning the inductance of the second LTCC inductor 305a or the capacitance of second varactor diode 313a. For example, If the inductance of the second LTCC inductor 305a or the capacitance of the second varactor diode 313a increases, the frequency response of the UHF matching circuit 109 decreases from the solid line 301b to the dotted line 303b. As a result, the maximum gain frequency decreases from 305b to 307b.

Figure 4A:
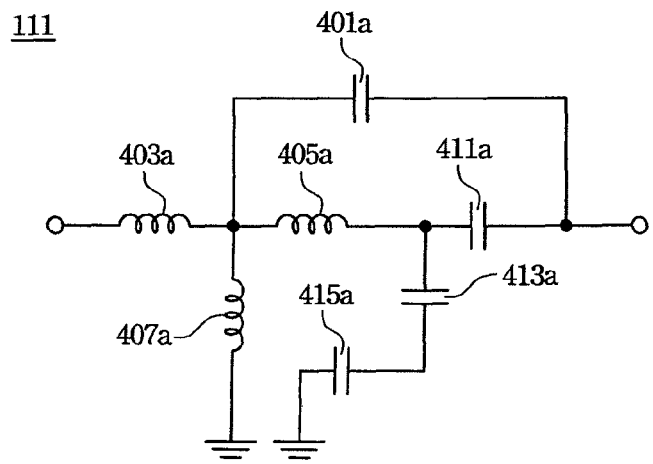
FIG. 4A is a Very High Frequency (VHF) tracking filter according to one embodiment of present invention.

FIG. 4A is the VHF tracking filter 111. The VHF tracking filter 111 includes a first LTCC inductor 405a, a first varactor diode 413a and a fine-tune capacitor 415a electrically connected. In addition, there are still other capacitors 401a, 411a and other inductors 403a, 407a electrically connected to the first varactor diode 413a and the first LTCC inductor 405a.

Figure 4B:
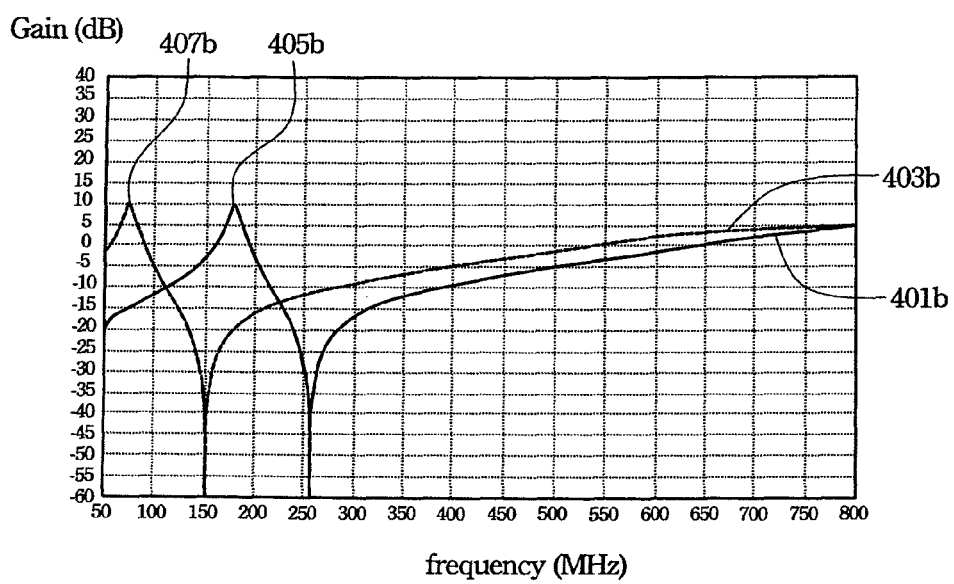
FIG. 4B is the frequency response of the VHF tracking filter according to one embodiment of present invention.

FIG. 4B is the frequency response of the VHF tracking filter 111. Because the capacitances of the fine-tune capacitor 415a and the first varactor diode 413a are inversely proportional to the frequency response of the VHF tracking filter 111, such that the maximum gain frequency of the VHF tracking filter 111 can be tuned by tuning the capacitances of the fine-tune capacitor 415a and the first varactor diode 413a.

If the capacitances of the fine-tune capacitor 415a or the first varactor diode 413a increases, the frequency response of the VHF tracking filter 111 decreases from the solid line 401b to the dotted line 403b, such that the maximum gain frequency decreases from 405b to 407b. On the contrary, if the capacitances of the fine-tune capacitor 415a or the first varactor diode 413a decreases, the frequency response of the VHF tracking filter 111 increases.

Figure 5A:
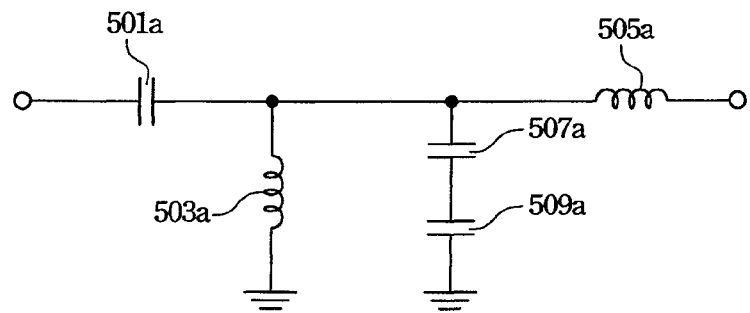
FIG. 5A is a VHF matching circuit according to one embodiment of present invention.

FIG. 5A is the VHF matching circuit 115. The VHF matching circuit 115 includes a second LTCC inductor 503a, a second varactor diode 509a and a capacitor 507a. The first end of the second varactor diode 509a is electrically connected to the first end of the capacitor 507a, the first end of the second LTCC inductor 503a is electrically connected to second end of the capacitor 507a. In addition, the capacitor 501a and LTCC inductor 505a are electrically connected to the second LTCC inductor 503a and the capacitor 507a.

Figure 5B:
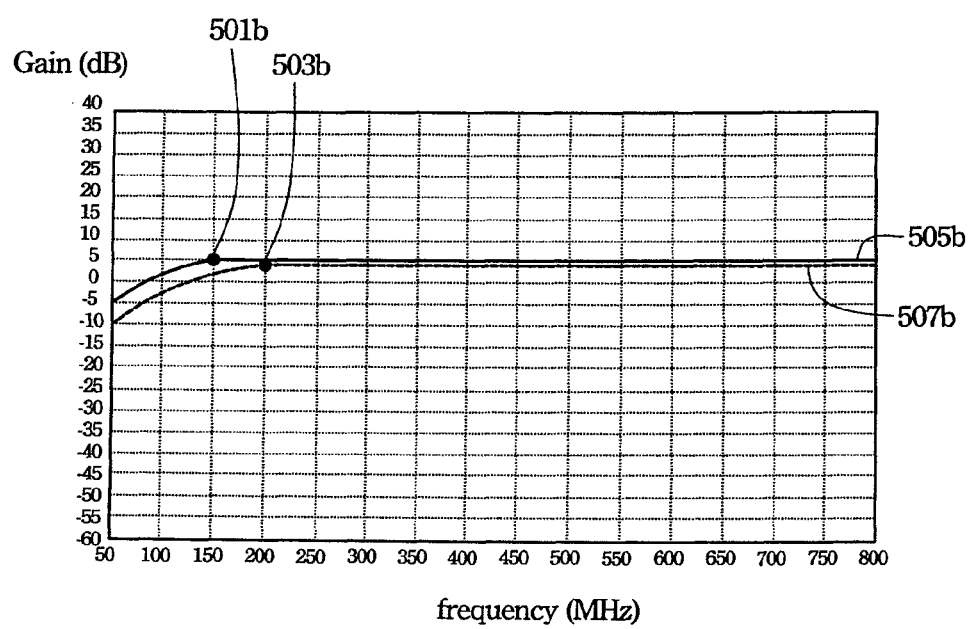
FIG. 5B is the frequency response of the VHF matching circuit according to one embodiment of present invention.

FIG. 5B is the frequency response of the VHF matching circuit 115. Because the inductance of the second LTCC inductor 503a is proportional to the frequency response of the VHF matching circuit 115, so the maximum gain frequency can be tuned by tuning the inductance of the second LTCC inductor 503a. If the inductance of the second LTCC inductor 503a increases, the frequency response moves from the solid line 505b to the dotted line 507b, as a result, the maximum gain frequency increase from the solid line 501b to the dotted line 503b.

Figure 6:
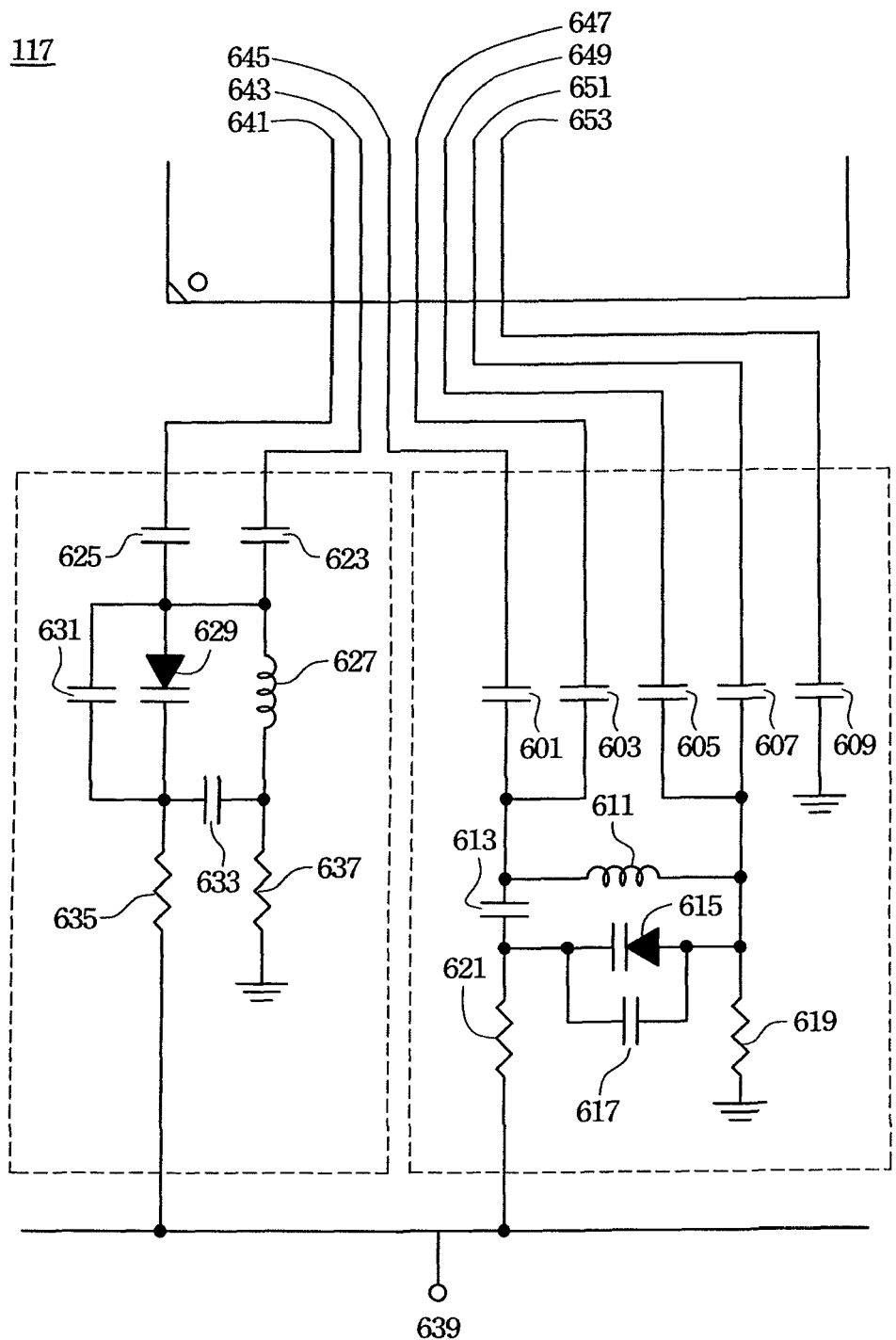
FIG. 6 is a single conversion Tuner IC according to one embodiment of present invention.

FIG. 6 is the single conversion Tuner IC 117 according to one embodiment of present invention. The single conversion Tuner IC 117 includes a third varactor diode 615, a third fine-tune capacitor 617, a third variable-capacitor 613, a third LTCC inductor 611 and a third resistor 621, in which the third fine-tune capacitor 617 is connected in parallel to the third varactor diode 615. The first end of the third variable-capacitor 613 is electrically connected to the first end of the third varactor diode 615 and the first end of the third fine-tune capacitor 617. The first end of the third LTCC inductor 611 is electrically connected to the second end of the third variable-capacitor 613. The second end of the third LTCC inductor 611 is electrically connected to the second end of the third varactor diode 615 and the second end of the third fine-tune capacitor 617.

The first end of the third resistor 621 is electrically connected to the first ends of the third varactor diode 615, the third fine-tune capacitor 617 and the third variable-capacitor 613, the second end of the third resistor 621 is electrically connected to a tuned-voltage generating terminal 639. In addition, the capacitors 601, 603, 605, 607 and 609 are electrically connected to the third varactor diode 615, the third fine-tune capacitor 617, the third variable-capacitor 613, the third LTCC inductor 611 and the resistor 619.

The third variable-capacitor 613 tunes the tuned-voltage such that the tuned-voltage falls within the range of 0 volts to 30 volts, then the third fine-tune capacitor 617 tunes the tuned-voltage slightly. The tuned-voltage tunes the capacitances of the first varactor diode 213a and second varactor diode 313a of the UHF tracking filter 105 and UHF matching circuit 109 respectively. If the tuned-voltage increases, the capacitances of the first varactor diode 213a and the second varactor diode 313a decrease.

The single conversion Tuner IC 117 further includes a third varactor diode 629, a third fine-tune capacitor 631, a third variable-capacitor 633, a third LTCC inductor 627 and a third resistor 635. The first end of the third LTCC inductor 627 is electrically connected to the first end of the third variable-capacitor 633. The second end of the third LTCC inductor 627 is electrically connected to the second end of the third varactor diode 629 and the second end of the third fine-tune capacitor 631.

The second end of the third variable-capacitor 633 is electrically connected to the second end of the third varactor diode 629 and the second end of the third fine-tune capacitor 631. The first end of the third resistor 635 is electrically connected to the second end of the third variable-capacitor 633, the second end of the third resistor 635 is electrically connected to a generating terminal of the tuned-voltage 639 with very high frequency.

The third variable-capacitor 633 tunes the tuned-voltage such that the tuned-voltage falls within the range of 0 volts to 30 volts, then the third fine-tune capacitor 631 tunes the tuned-voltage slightly. The tuned-voltage tunes the capacitances of the first varactor diode 413a and second varactor diode 509a of the VHF tracking filter 111 and VHF matching circuit 115 respectively. If the tuned-voltage increases, the capacitances of the first varactor diode 413a and the second varactor diode 509a decrease.

According to the embodiments, the tracking filters and matching circuits of the TV tuner use LTCC inductors instead of air coils, which reduces the volume of the TV tuner such that the digital TV can be portable. In addition, the plugging process of the air coils done by human hands can be omitted, which reduces the cost.

Any element in a claim that does not explicitly state "means for" performing a specified function, or "step for" performing a specific function, is not to be interpreted as a "means" or "step" clause as specified in 35 USC §112, ¶ 6. In particular, the use of "step of" in the claim herein is not intended to invoke the provisions of 35 USC §112, ¶ 6.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A TV tuner comprising:
    a single conversion Tuner IC;
    an Ultra High Frequency (UHF) tracking filter comprising at least one first Low-Temperature Co-fired Ceramics (LTCC) inductor, a first varactor diode and a fine-tune capacitor electrically connected to determine a maximum gain frequency of the UHF tracking filter;
    a UHF matching circuit comprising at least one second LTCC inductor, a second varactor diode and a capacitor electrically connected to determine the maximum gain frequency of the UHF matching circuit;
    a pre-amplifier, electrically connected to inputs of the UHF tracking filter, configured to amplify input signals; and
    a second amplifier, electrically connected between the UHF tracking filter and the UHF matching circuit, configured to amplify output signals of the UHF tracking filter.

2. A TV tuner comprising:
    a single conversion Tuner IC;
    an Ultra High Frequency (UHF) tracking filter comprising at least one first Low-Temperature Co-fired Ceramics (LTCC) inductor, a first varactor diode and a fine-tune capacitor electrically connected to determine a maximum gain frequency of the UHF tracking filter; and
    a UHF matching circuit comprising at least one second LTCC inductor, a second varactor diode and a capacitor electrically connected to determine the maximum gain frequency of the UHF matching circuit;
    wherein a first end of the first varactor diode is connected to a first end of the fine-tune capacitor, a first end of the first LTCC inductor is electrically connected to a second end of the fine-tune capacitor, a second end of the first LTCC inductor is electrically connected to a second end of the first varactor diode.

3. The TV tuner as claimed in claim 1, wherein the capacitances of the fine-tune capacitor and the first varactor diode are inversely proportional to the determined maximum gain frequency of the UHF tracking filter.

4. A TV tuner comprising:
    a single conversion Tuner IC;
    an Ultra High Frequency (UHF) tracking filter comprising at least one first Low-Temperature Co-fired Ceramics (LTCC) inductor, a first varactor diode and a fine-tune capacitor electrically connected to determine a maximum gain frequency of the UHF tracking filter; and
    a UHF matching circuit comprising at least one second LTCC inductor, a second varactor diode and a capacitor electrically connected to determine the maximum gain frequency of the UHF matching circuit;
    wherein a first end of the second varactor diode is electrically connected to a first end of the capacitor, a first end of the second LTCC inductor is electrically connected to a second end of the second varactor diode, and a second end of the second LTCC inductor is electrically connected to a second end of the capacitor.

5. The TV tuner as claimed in claim 1, wherein the capacitances of the second varactor diode and the inductance of the second LTCC inductor are inversely proportional to the determined maximum gain frequency of the UHF matching circuit.

6. The TV tuner as claimed in claim 1, wherein the single conversion Tuner IC comprises:
    a third varactor diode;
    a third fine-tune capacitor, connected in parallel to the third varactor diode;
    a third variable-capacitor, wherein a first end of the third variable-capacitor is electrically connected to first ends of the third varactor diode and the third fine-tune capacitor;
    a third LTCC inductor, wherein a first end of the third LTCC inductor is electrically connected to a second end of the third variable-capacitor, a second end of the third LTCC inductor is electrically connected to a second end of the third varactor diode and a second end of the third fine-tune capacitor; and
    a third resistor, wherein a first end of the third resistor is electrically connected to the first end of the third varactor diode, the first end of the third fine-tune capacitor and the first end of the third variable-capacitor, a second end of the third resistor is electrically connected to a generating terminal of a tuned-voltage with ultra high frequency.

7. The TV tuner as claimed in claim 6, wherein the magnitude of the tuned-voltage with ultra high frequency is inversely proportional to the capacitances of the first varactor diode and the second varactor diode.

* * * * *